United States Patent [19]

Knight et al.

[11] 4,156,191

[45] May 22, 1979

[54] METHOD AND APPARATUS FOR ADJUSTING THE MAGNETIC COUPLING BETWEEN A HALL EFFECT SWITCH AND A PERMANENT MAGNET

[75] Inventors: Michael H. Knight, Pontiac; Clarence L. Eagle, Livonia, both of Mich.

[73] Assignee: Gulf & Western Manufacturing Company, Southfield, Mich.

[21] Appl. No.: 844,025

[22] Filed: Oct. 20, 1977

[51] Int. Cl.² .................................................. G01R 35/00
[52] U.S. Cl. .................................... 324/202; 324/205; 324/228
[58] Field of Search ............... 324/202, 205, 227, 228, 324/235, 16 T; 361/148, 267; 307/309; 123/146.5 A, 148 E, 154

[56] References Cited

U.S. PATENT DOCUMENTS

| 3,235,776 | 2/1966 | Ireland | 324/205 |
| 3,479,584 | 10/1969 | Casey | 361/148 |
| 4,011,476 | 3/1977 | Beard | 324/179 |

Primary Examiner—Robert J. Corcoran
Assistant Examiner—Walter Snow
Attorney, Agent, or Firm—Meyer, Tilberry & Body

[57] ABSTRACT

A method and apparatus for setting the relative magnetic relationship between a Hall Effect switch with a given operating field strength and a permanent magnet to operate the switch and having a magnetic field with a field strength greater than the operating field strength. This invention can be used for adjusting the toggle point of a combined Hall Effect switch and magnet or the dwell between the operate point and release point of the switch. This method or apparatus comprises the steps of determining the actual switching point or dwell of a combined Hall Effect switch and operating magnet, which switching point or dwell is controlled by the combination of the field strength of the magnet and the operating field strength of the switch, determining the difference between the actual switching point or dwell and a desired switching point or dwell and then modifying the magnetization of the permanent magnet to shift the actual switching point or dwell toward the desired switching point or dwell. This method and apparatus can be operated a series of times to bring the point or dwell toward the desired value and the desired switching point or dwell is within a selected range. The method is used to set the spacing between both the operate point and the release point of the switch to control the dwell of a unit used in the ignition system of an internal combustion engine and which includes a magnet and a Hall Effect switch mounted together.

14 Claims, 17 Drawing Figures

STEP (1) DEMAGNETIZE
WITH X AMPS      X ~ ΔD₁

STEP (2) DEMAGNETIZE
WITH X+a AMPS   a ~ ΔD₂
                a < X

STEP (3) DEMAGNETIZE
WITH X+a+b AMPS  b ~ ΔD₃
                 a < b
           ⋮
STEP (n) ΔDₙ IN LIMITS

DWELL = VANE WIDTH + $(X_o + X_r)$ (a) $X_o + X_r = 2X_o - (X_o - X_r)$ (b) $X_o + X_r = 2X_r + (X_o - X_r)$

SLOPE = $\dfrac{HYS}{X_o - X_r}$

∴ CHANGE SLOPE
   TO ADJUST DWELL
   (LIMITS $B_{MAX}$ TO $B_{MIN}$ FOR HYS)

METHOD AND APPARATUS FOR ADJUSTING THE MAGNETIC COUPLING BETWEEN A HALL EFFECT SWITCH AND A PERMANENT MAGNET

This invention relates to the art of producing Hall Effect switches in combination with operating magnets therefor and more particularly to a method of programming Hall Effect switches and apparatus for performing this method.

BACKGROUND OF DISCLOSURE

Recently, a substantial amount of work has been devoted to the concept of employing a Hall Effect digital switch as an ignition device for an internal combustion engine and for proximity switches or limit switches, to name a few applications. As is well known, a Hall Effect digital switch is an integrated circuit device including a Hall cell which changes state upon the application of an increasing and decreasing magnetic flux field. The state changes in flux increasing direction at an "operate point" and in a flux decreasing direction at a "release point". These switch toggle points exist for any given Hall Effect digital switch at specific magnetic flux fields at the switch. By mounting a permanent magnet so that its magnetic flux field is exposed to the Hall Effect cell of the Hall Effect digital switch, a flux affecting element passing in the space or gap between the switch and the magnet, or otherwise adjacent the magnet, can change the output status of the switch. The status change or actuation occurs when the amount of magnetic coupling between the permanent magnet and switch changes to a given degree. In combined magnets and Hall Effect switches, it is desirable to obtain at least one specific, known switching or actuation point or condition between the magnet and the switch. Often it is necessary to have a given, known spacing, or dwell, between the two toggle points as the magnet and Hall Effect switch is subjected to a variable flux field. This switching point and/or dwell is a combined function of the inherent toggle point or points of the Hall Effect switch and the magnetic strength and spacing of the magnets from the Hall Effect cell in the switch. To obtain a desired switching point or dwell in a combined permanent magnet and Hall Effect digital switch, it has been the practice to sort magnets and Hall Effect switches into specific ranges and then group these ranges and by trial and error obtain a desired switching point. This is a time consuming process and results in somewhat erratic matching between the Hall Effect switch and the permanent magnet used in controlling the switch.

THE INVENTION

In accordance with the present invention, there is provided an improved method of setting to a desired point the switching point and/or dwell of a unit comprising a Hall Effect digital switch and a magnet wherein an external field from the magnet intersects the switch. When the dwell is being adjusted or set each of the two toggle points is adjusted to change their spacing in relation to a changing flux field. The present method overcomes the disadvantages of the trial and error procedure heretofore utilized and results in more uniform and closely controlled switching point or points for such a combined unit. The method can set a desired spacing or dwell between the operate point and the release point in basically the same manner as a single toggle point is set.

The present invention comprises the steps of determining the actual switching point or dwell of the unit, comparing the actual switching point or dwell to the desired switching point or dwell and, if the actual switching point or dwell differs from the desired switching point or dwell by more than a selected level, modifying the external magnetic field of the magnet in a polarity direction tending to shift the actual switching point or dwell toward the desired switching point or dwell. In accordance with the invention, these steps are repeated until the actual switching point or dwell differs from the desired switching point or dwell by less than a selected level. In the preferred embodiments the magnets are saturated and each measured difference between the desired point or dwell causes demagnetization of the companion magnet. If the demagnetization exceeds the desired correction, this is detected and rejects the unit for reprocessing by again saturating the magnet, if practical.

The inventive process can be used for setting units of Hall Effect switches and magnets to assure that the matched units are as close as possible to the desired switching point, dwell or other operating parameters. More importantly, this type of process can be used on a continuous basis and in an automatic machine for adjusting the switching point or dwell of randomly selected Hall Effect digital switches and operating magnets therefor without any manual handling of the unit except to place it in the machine or apparatus. By cycling the measuring and demagnetizing steps several times, the magnetic field of the magnet is adjusted while in a machine to obtain the desired switching point or dwell. This is a substantial advance over prior systems wherein grouping and matching procedures were employed.

In accordance with one aspect of the invention, the external magnetic field is adjusted by demagnetizing the permanent magnet. In this manner, the switching point can be adjusted outwardly over a large range of magnetic fields determined by the lowest practical demagnetization of the permanent magnet as long as the lower value is still sufficient to operate the switch when fully exposed to the internal Hall Effect cell of the digital switch. Of course, the magnet could be magnetized to change the dwell or operating points without departing from the intended scope of the invention.

In accordance with another aspect of the present invention, there is provided an apparatus for performing the method as set forth above. This apparatus includes means for determining the actual switching point or dwell of the unit, means for comparing the actual switching point or dwell to the desired switching point or dwell to develop a difference indication between the desired switching point or dwell and the actual switching point or dwell and means for modifying the magnetic field of the magnet in a polarity direction tending to shift the actual switching point or dwell toward the desired switching point or dwell. This method can be automatically controlled by available logic circuitry. Such modification is preferable by demagnetizing the magnet to spread the toggle points; however, magnetization to shift the toggle points together could be used.

The primary object of the present invention is the provision of an improved method and apparatus for setting, to a desired point or dwell, the switching point or points of a unit including a Hall Effect digital switch and a permanent magnet.

Still a further object of the present invention is the provision of a method and apparatus as defined above, which method and apparatus is easy to use and produces uniform switching results without manual manipulation.

Still a further object of the present invention is the provision of a method and apparatus as defined above, which method and apparatus does not require manual sorting and/or grouping of the magnets and/or Hall Effect digital switches.

Another object of the present invention is the provision of a method and apparatus as defined above, which method and apparatus can be used with a variety of Hall Effect digital switches and more particularly to combined units of such a switch and an operating magnet.

These and other objects and advantages will become apparent from the following description taken together with the accompanying drawings which are described below.

BRIEF DESCRIPTION OF DRAWINGS

In the present description, the following views are employed.

SWITCHING POINT ADJUSTMENT

Figure 1:
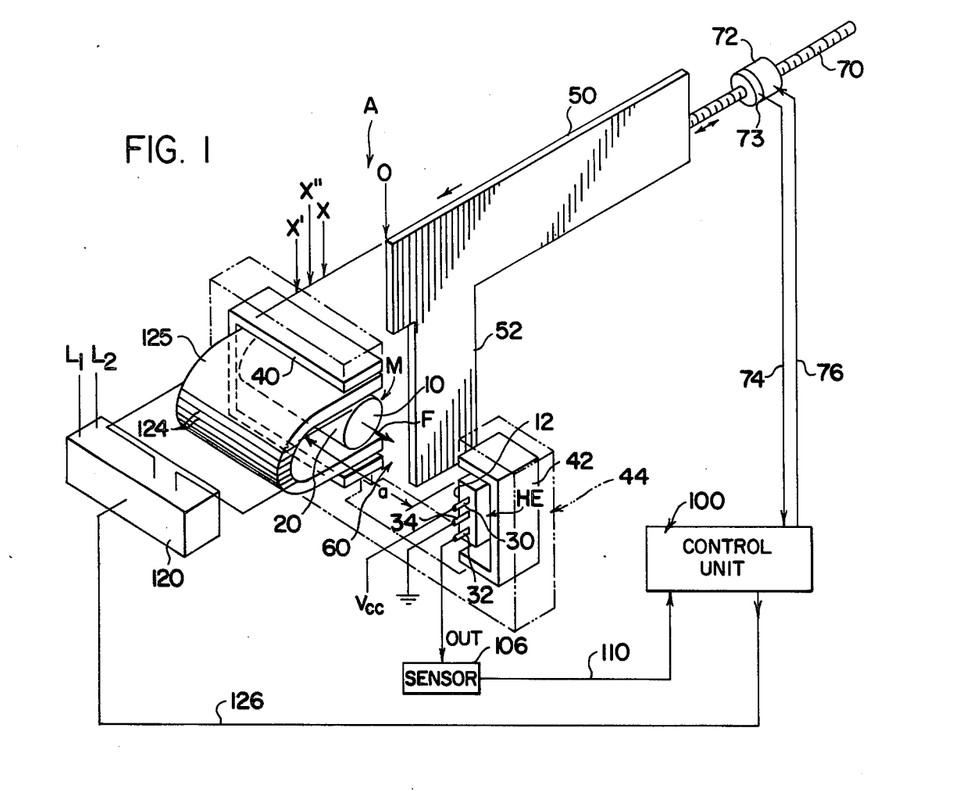
FIG. 1 is a pictorial, schematic partial view illustrating a preferred embodiment of the present invention for setting a toggle point.

Referring now to the drawings wherein the showings are for the purpose of illustrating preferred embodiments only, and not for the purpose of limiting same, FIG. 1 schematically illustrates a device A for setting a desired switching point between a somewhat standard Hall Effect digital switch HE and a permanent magnet M mounted adjacent thereto. As is well known in the art, a Hall Effect switch has two points at which it toggles. These toggle points, switch points or actuation points are related to inherent characteristics of the switch itself, the magnitude of the magnetic flux field being exposed to the internal Hall Effect cell and the biasing voltage. Manufacturing techniques and variables affect these switching points and make it difficult to select a magnet and switch which can operate accurately.

For the purposes of this disclosure, the internal Hall Effect cell of switch HE is considered to be the switch itself, which switch is magnetically coupled with the flux field F emanating from pole surface 10 of magnet M in the general direction indicated by the arrow F in FIG. 1. This arrow extends toward surface 12, which is considered to coincide with the Hall Effect cell within switch HE. Thus, the flux field F extending from pole surface 10 toward upper, or control surface 12, of Hall Effect switch HE has sufficient strength to control the operation of the Hall Effect switch. The switching point to be adjusted is considered to be the parameter at which switch HE toggles when considering the combined action of the magnetic field and the inherent characteristics of the digital switch. Switches often toggle at different flux densities; therefore, to maintain a selected switching point the magnetic field F must be correlated with the inherent characteristics of the companion switch. Apparatus A performs a method of setting the one switching point of the combined unit including Hall Effect digital switch HE and magnet M spaced from each other a distance a. The magnetic field strength of field F is sufficiently high to allow operation of switch HE or the spacing a is sufficiently small for this purpose. Indeed, the magnet is often saturated then stabilized slightly. Full magnetization of magnet M is sufficient to span the toggle points of the digital switch so that the switch toggles as shown in FIG. 4 when the flux is changed at the switch.

Permanent magnet M can be formed from any available permanent magnet material such as Alnico, plastic bonded Alnico, and plastic bonded powdered ferrite, to name only a few. In accordance with the illustrated embodiment, magnet M is magnetized radially to produce a magnetic field at surface 10. The magnet includes an outer cylindrical surface 20. Other shapes could also be used to produce the necessary magnetic flux field for controlling the operation of the switch HE.

Figure 4:
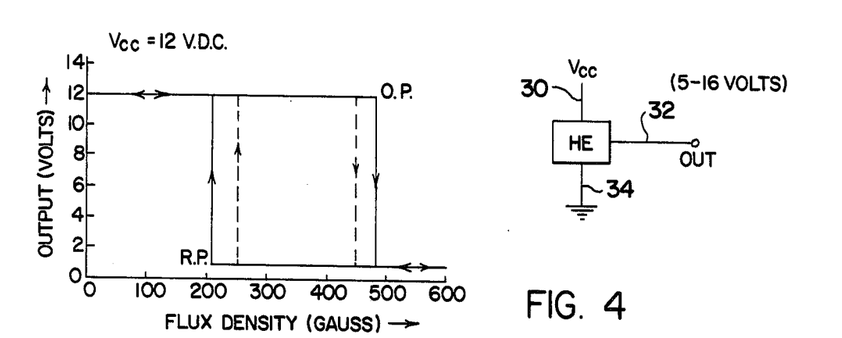
FIG. 4 is a graph showing, in general terms, known operating characteristics of Hall Effect digital switches and a schematic representation of a Hall Effect digital switch.

The Hall Effect digital switch being used in conjunction with a permanent magnet has a hysteresis type of curve as illustrated in FIG. 4. A biasing D.C. voltage $V_{cc}$ at terminal 30 controls the Hall Effect switch having an internal voltage regulator. A voltage above the regulated voltage is applied and Hall Effect switch HE operates substantially in accordance with FIG. 4. As the flux density increases at surface 12, a selected operating flux OP is reached. This is the "operate point" of the Hall Effect switch and causes the output terminal 32 to shift from a high logic condition to a low logic condition. As the flux is decreased from above the operate point, a flux is reached at point RP which is known as the "release point" of switch HE. This is shifted to the left and requires a lower amount of flux. Each of these points is considered toggle points or switching points for digital switch HE so that the switch is toggled between a high logic and a low logic. Although the high and low logic may have various values, in the illustrated embodiment, a Sprague Integrated Circuit ULS-3006T is employed. In this embodiment using a 12 volt D.C. biasing voltage, the high logic is approximately 12 volts D.C. and the low logic is approximately 0.5 volts D.C. These operating characteristics of the Hall Effect switch are well known. In the completed connection of switch HE, terminal 34 is grounded.

Referring again to FIG. 1, as the coupling flux increases between surface 10 and the Hall Effect switch, the operate point OP of FIG. 4 is reached. At that time, the logic on output terminal 32 shifts from a high logic to a low logic. Continuation of the increased flux has no effect upon the logic condition at the output terminal. As the flux coupling decreases, as shown in FIG. 4, there is a point at which output terminal 32 shifts from a low logic to a high logic. This is the release point RP which is at a substantially lower flux density than the operate point. As shown in dashed lines in FIG. 4, the operate point and release point of various Hall Effect digital switches may vary; therefore, this parameter or characteristic, taken together with variations in the flux field from a permanent magnet M, produces various switching parameters or switching points which are the combined action of the flux field and the inherent operating characteristics of a Hall Effect digital switch.

Apparatus A is used to set one switching point so that it is uniform with each unit or combination of a selected magnet and matching digital switch. In accordance with this invention, apparatus A includes means for supporting magnet M a distance a from surface 12 of switch HE. A variety of arrangements could be used for this mounting purpose; however, in accordance with the illustrated embodiment, brackets 40, 42 fixedly secure the switch and magnet and are, in turn, mounted as a unit in a fixture 44, as shown in phantom lines. This fixture could include an adjustable arrangement to allow adjustment to the spacing a between the magnet and surface 12. The spacing or gap is not used, in this embodiment and the fixture holds the switch and magnet in fixed relationship. The spacing of the magnet from the switch could be used to change the switching point, which is controlled by the flux intensity created by the magnet at surface 12 and the inherent characteristics of the Hall Effect digital switch. This is referred to as the magnetic coupling between the magnet and the switch. This is not used in the preferred embodiments.

In accordance with the illustrated apparatus, a movable magnetic shield element 50 includes a downwardly extending vane 52 formed from a magnetically permeable material which absorbs magnet flux and reduces the amount of flux extending therethrough. As element 50 is moved from the right to the left, as shown in FIG. 1, the magnetic coupling between the magnet and the switch within gap 60 is reduced. Thus, the flux field or coupling between the magnet and the switch is decreased as vane 52 progresses into gap 60 from a position at least at position O, as shown in FIG. 1. Thus, as vane 52 progresses into the gap, ultimately the coupling field strength will be decreased to the point wherein switch HE is toggled to shift output 32 from a low logic to a high logic, as shown in FIG. 4. Of course, vane 52 could be shifted from a position between the magnet and the switch to cause the coupling magnetic field to increase from a low value to a high value; therefore, shifting from a high logic to a low logic at the operating point, as shown in FIG. 4. In this preferred embodiment, vane 52 moves into gap 60 for the purposes of measuring the combined magnetic interrelationship between the flux field intensity of magnet M, generally fixed distance a and the inherent operating characteristics of switch HE, as generally illustrated in FIG. 4.

Figure 2:
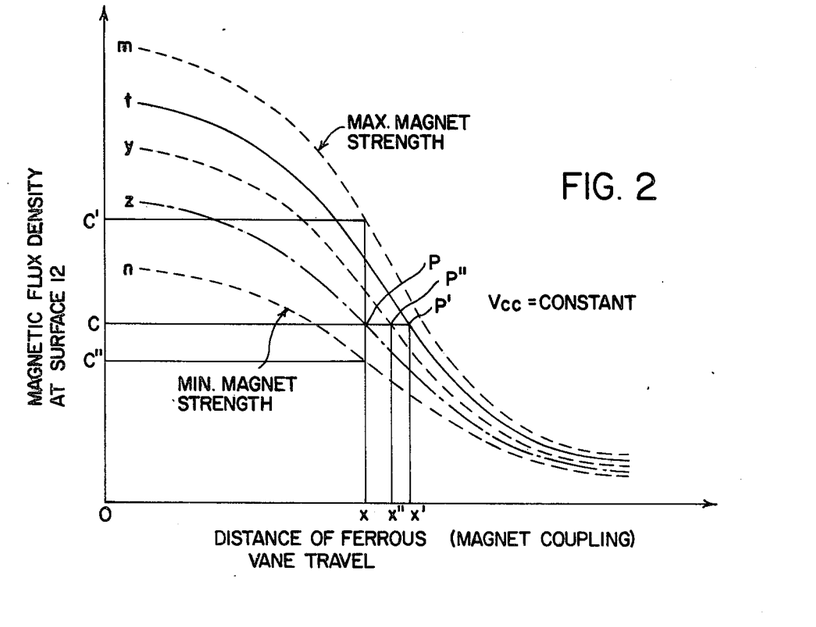
FIG. 2 is a chart illustrating an operating characteristic of the preferred embodiment as shown in FIG. 1.

Referring now to FIG. 2, the chart illustrates the magnetic coupling field at one portion of the flux field exposed to switch HE as the vane 52 is moved. These curves show the flux density between magnet M and switch HE for various states of magnetization of the magnet. Upper curve m represents the maximum field strength obtainable by a particular permanent magnet. In other words, the saturation magnetization of the magnet is represented by this curve. Lower curve n represents a minimum or lower magnetization for magnet M, which magnetization is below the maximum magnetization m, but which is sufficiently high to create operation of the switch at a desired switching point P which corresponds to the vane travel position in the illustrated graph. In this graph, the horizontal line C represents the actuation point for a representative Hall Effect switch HE. This line is between an upper horizontal line C', which represents the highest operating characteristic which can be switched at position x with maximum magnetic strength, and a lower horizontal line C'' which represents the lowest operating point for the Hall Effect switch which can be operated by the lower or minimum magnetic strength of curve n which can be an arbitrary lower magnetization amount. In other words, to obtain a switching point which is determined at point x in the parameters illustrated in FIG. 2, the permanent magnet must be demagnetizable between upper curve m and lower curve n to provide acceptance of a Hall Effect switch having operating points or within the range determined by the vertical spacing between horizontal lines C', C''. Assuming that the selected Hall Effect switch has the characteristic shown in horizontal line C and the permanent magnet M is magnetized along the magnetization line t which is near saturation, as vane 52 progresses from position O into gap 60, terminal 32 will be toggled at the release point RP of Hall Effect switch HE at point P'. If the parameter being sought is position x, the flux coupling between the magnet and the cell is too great. Vane 52 toggles switch HE at point x', which is beyond desired point x. Thus, it is necessary to reduce the field density at surface 12. In accordance with the illustrated embodiment, this is done by demagnetizing magnet M with a first field generally controlled by the spacing between x' and x so that the flux field is at a lower value which may be at value y shown in FIG. 2. In this instance, the Hall Effect switch will toggle during actuation of element 50 at a point P". This corresponds to position x" and still indicates the higher magnetic coupling than desired for a set switching characteristic for the combined magnet and Hall Effect switch. Thus, further demagnetization takes place by demagnetizing magnet M with a second field higher than the first field by an amount determined by the spacing of x" and x. Thereafter, the magnetization is illustrated as graph z. In this instance, the switching point P corresponds to the position x which is the selected standard for combined magnet and Hall Effect switches. Thus, the combination is now set to operate in accordance with the preselected standard determined by the position of vane 52 at which output 32 toggles. Thus, the combined action of the magnetic field from magnet M and the internal characteristics of Hall Effect switch HE is sufficient to produce uniform results irrespective of the inherent inaccuracies in the operating conditions for various Hall Effect switches.

As can be seen in FIG. 2, as the actuation characteristic of a different Hall Effect switch varies from the representative switch the operation of the different switch will fall at a different point between C'-C". If the switch operates at point C', the measured difference between a saturated magnet and the desired toggle point will require no demagnetization because the toggle point corresponds with x. If the switch operates along line C" it will be necessary to demagnetize the magnet to the minimum strength, illustrated by curve n. Thus, as shown in FIG. 2, after measuring or testing the toggle point for terminal 32 sufficient demagnetization is used to decrease flux until the switching point of the combined magnet and switch is modified to about point x. This is done by demagnetizing magnet M to change the flux lines. Also, flux robbers could be used to change the strength of field F or spacing a of gap 60 or the biasing voltage could be changed to adjust the switching point. In this preferred embodiment, demagnetization of magnet M is used because of its ease in operation.

Figure 3:
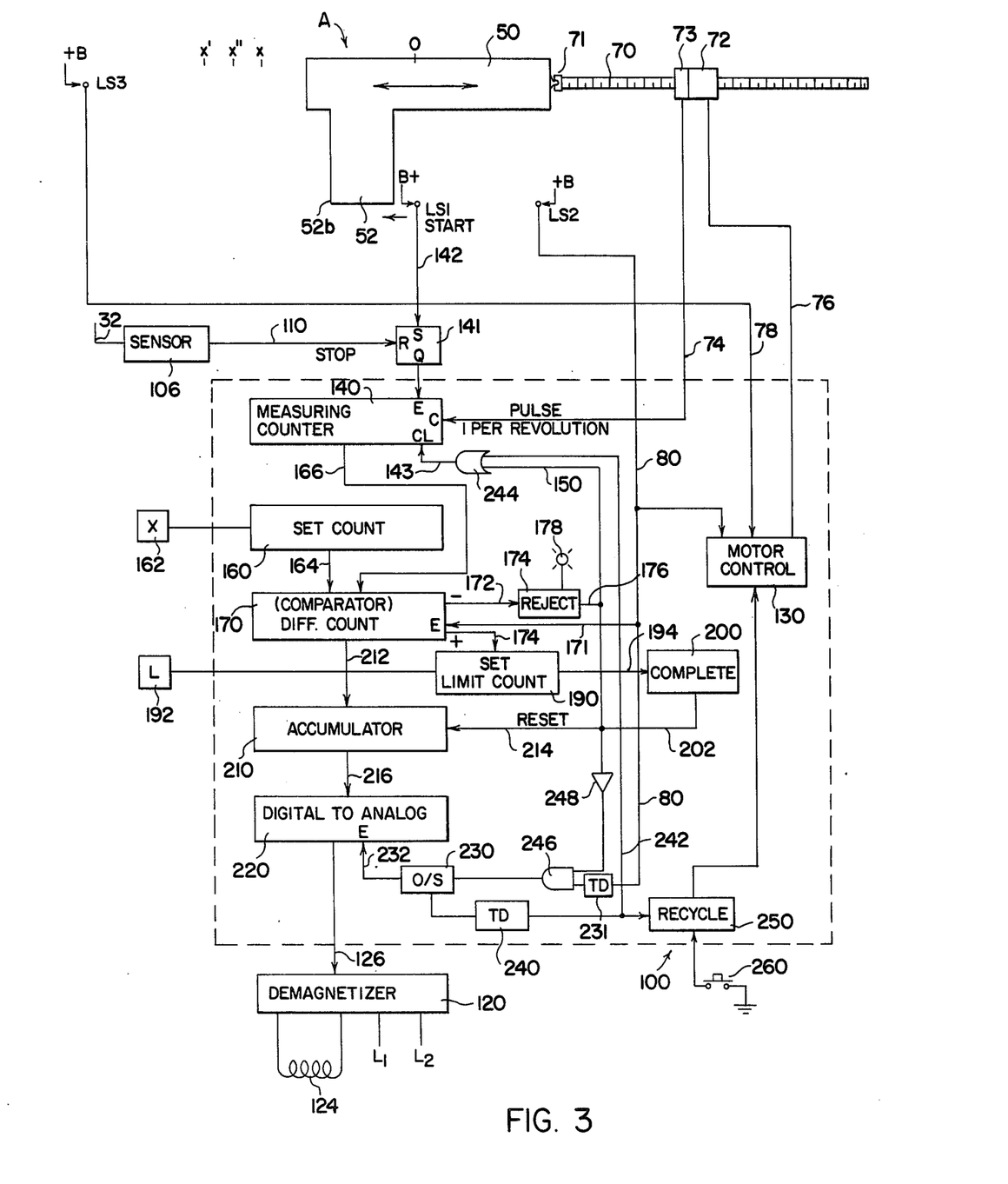
FIG. 3 is a schematic logic and operating diagram employed in the control circuit of the preferred embodiment of the present invention, as shown in FIG. 1.
Figure 5:
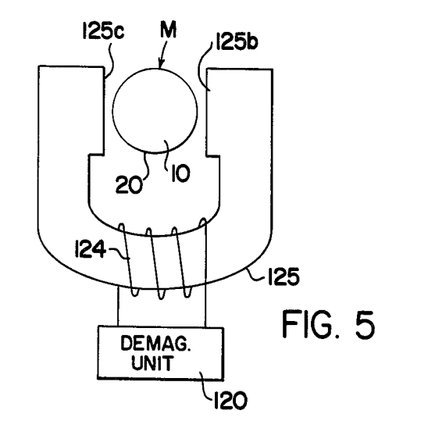
FIG. 5 is a schematic view of the demagnetizing unit employed in both preferred embodiments of the invention.

Referring again to FIG. 1, the method as so far explained can be performed by the schematically illustrated apparatus A. In this instance, a screw 70 is rotated by motor 72 to drive vane 52 into and out of gap 60. After testing of the toggle point, motor 72 proceeds to the end of the vane travel and then reverses and retracts screw 70 and element 50 to complete a measured cycle. The transverse position of screw 70 at any time in the measuring or testing cycle determines the amount of movement of vane 52 from position O toward the toggle position of switch HE. This transverse movement is converted into pulses by encoder 73, the number of pulses after position 0 is proportional to the amount of movement from position 0 and the pulses are directed through line 74 to a main logic and control device, or analyzer, 100 which also operates rotatable drive motor 72 for axially moving screw 70 by control line 76. This screw 70 drives vane 52 in and out of gap 60 for the successive measuring and testing of the toggle point for switch HE. After the switching point of the switch is within a certain spacing from the desired point x, further demagnetization change is not required and control unit 100 releases apparatus A from further operations so that the matched unit including magnet and Hall Effect switch can be removed and stored for subsequent use. The toggle position of switch HE sensed at terminal 32 can be determined by a sensor 106 which may be a logic gate controlling line 110, which is connected to the control unit 100. As will be explained later this line determines the spacing of the toggle point from a selected point O. Thus, the control unit receives information when terminal 32 toggles between a low logic and a high logic upon movement of element 50 by screw 70. At the same time, the amount of movement of the element 50 between reference position O and the toggle point is recorded by a circuit as shown in FIG. 3. If this distance is too great, i.e. above a selected value or amount, the magnet M is demagnetized by demagnetizer 120 receiving power from lines L1, L2. Schematic details of the demagnetizer are shown in FIG. 5. A demagnetizing coil 124 is wrapped around core 125 with poles 125b, 125c to demagnetize the magnet in accordance with the spacing of the switch toggle point and the desired switching point for a switching characteristic represented by the distance x in the travel of element 50. Demagnetizer 120 is controlled by signals in line 126 which line carries an analog signal that determines the amount of current flow through coil 124 from demagnetizer 120. Control unit 100 provides an analog signal in line 126 which is indicative of the amount of flux density to be used to demagnetize magnet M. In this manner, magnet M is demagnetized. The amount of magnet change is determined by the spacing between the desired switching point and the actual switching point in a manner to be explained later in relation to FIG. 3. The permanent magnet is demagnetized progressively in accordance with the successive spacings between the actual toggle point and the desired toggle point x for the desired switching point or switching characteristic of the combined magnet and switch. The value or level of the analog signal in line 126 is controlled by the amount of spacing between the actual switching point and the desired switching point. This value must be increased by the previous demagnetization amounts to progressively change the field of magnet M accomplished by the circuit in FIG. 3. After a given demagnetization cycle, the measuring and demagnetizing cycle has been completed and a new test or measurement should be conducted to determine the deviation between the actual switching point and the desired or design switching point. Control unit 100 can include a time delay at the end of the movement of vane 52 and demagnetization and before recycling to allow operation of demagnetizer 120 and to allow for the demagnetizing field to collapse. This process of measuring the spacing and changing the magnetization of magnet M is continued until the actual switching point does not deviate from the standard or desired switching point by more than a preselected amount which is a design characteristic to be incorporated into apparatus A. Since the demagnetization of magnet M is proportional to the measured spacing and continues to increase over prior demagnetization cycles, the actual switching point can come quite close to the design or desired switching point i.e. within about 0.004–0.002 inches. If this process shifts the toggle point to the right of point x, then the unit is rejected and resaturated for processing again unless defective.

Referring now to FIG. 3, there is shown a preferred schematic logic and operating diagram of a control system and apparatus for performing the method of setting a toggle point to approximately position x, as previously described. As illustrated, motor 72 drives element 50 guided to reciprocate in the direction of the arrows by a reversibly rotated screw 70. A rotatable joint 71 joins the reciprocating element 50 to screw 70 rotated by motor 72 through an appropriate motor control 130. The toggle measuring vane 52 is thus driven by screw 70 until the vane 52 or element 50 actuates cycle reversing limit switch LS3. When this switch is actuated, line 78 causes motor control 130 to reverse screw rotating motor 72 and drive the screw 70 in the reverse direction until limit switch LS2 is actuated by either element 50 or vane 52. Line 80 then causes motor control 130 to stop motor 72 in the retracted position. Thus, during each measuring cycle, motor 72 drives vane 52 to the left until limit switch LS3 is actuated beyond the normal operating range for the Hall Effect switch as shown in FIG. 1. Thereafter, during the same measuring cycle, motor 72 reverses screw 70 and shifts the vane 52 back to the cycle stopping limit switch LS2 which completes reciprocation of element 50 for a single cycle measuring the spacing between the actual toggle point of Hall Effect switch HE and a selected reference point or position O. Of course screw 70 could be extended between limit switches LS2 and LS3 and be axially stationary. In this arrangement a matching nut through which the screw would pass could be fixed to element 50. As motor 72 rotates the screw, the action of the screw in the element mounted nut would reciprocate the element in the direction of the illustrated arrows. During movement to the left, limit switch LS1, corresponding to the reference position O, is operated by a selected portion of vane 52. This is usually the leading edge 52b. Position O at actuation of switch LS1 can be determined by another part of element 50 if desired. The actuation of switch LS1 energizes line 142 by B+ voltage to set a flip-flop 141 which energizes or enables a measuring binary counter 140. This counter receives 100 pulses from encoder 73 during each revolution of screw 70 by motor 72 through line 74. A revolution or part thereof of screw 70 relates to and indicates a known amount of transverse movement of element 50 and vane 52. In practice, each revolution of screw 70 is 0.10 inches so that each pulse received from line 74 by binary counter 140 corresponds to 1/100 of a revolution of motor 72 and indicates 1/1000 of an inch movement of vane or toggle device 52. When limit switch LS1 is actuated by vane 52 being in a position corresponding to position O, flip-flop 141 is set to enable counter 140. Thus, measuring counter 140 counts the pulses corresponding to the rotation of the element reciprocating screw 70. These pulses are continued until flip-flop 141 is reset by a toggle signal in line 110 directed from toggle sensor 106 controlled by the switch toggle point at terminal 32 of the Hall Effect switch. In other words, digital counter 140 starts counting at a selected position O determined by actuation of switch LS1 and counts pulses from line 74 until the Hall Effect switch has toggled at the release point as sensed by sensor 106. Since the pulses in line 74 relate to a selected amount of transverse movement of screw 70, in this instance 1/1000 of an inch, the binary count stored in counter 140 is the measured distance between a point or position O and the actual toggle point for the Hall Effect switch. Of course the reference position O can be set at any convenient position. As will be explained later, a signal in line 143 connected to the CL or clear count terminal of counter 140 clears the binary counter for the next measurement during reciprocation of vane 52 from limit switch LS2 to switch LS3. Limit switch LS1 is unidirectional as indicated and does not set flip-flop 141 when element 50 is moved in the reverse direction from limit switch LS3 to limit switch LS2.

A desired binary count is manually set into count register 160 by an appropriate adjustable binary switching network 162, which is manually adjusted in increments of 0.001 to any desired spacing between position O and position x. Thus, the binary count set into register 160 is the desired spacing between the reference position O and the desired toggle point x of switch HE controlled by magnet M when exposed to moving vane 52. A binary comparator or difference count device 170 compares the measured count accumulated in count 140 during a measuring cycle in line 166 with the set count in register 160 contained in lines 164 at the end of a cycle by enabling line 171. Although lines 166, 164 are shown as a single line they contain a number of lines to carry a binary count. In practice the count is contained on eight lines. Binary comparator 170 records the difference in these two binary counts which count difference, in this preferred embodiment, is recorded in increments of 1/1000 of an inch. If the toggle point is before screw 70 traverses to a position corresponding to point x, binary comparator 170 produces a signal in a negative comparison line 172 when enabled by line 171. This negative comparison is when the count in counter 140 does not reach or exceed the count in register 160. A signal in line 172 actuates a reject circuit 174 indicating that the unit being tested can not be adjusted by further demagnetization of magnet M. In that instance, a signal is received in line 176 to produce a pulse in line 150 to clear counter 140 at the CL terminal by OR gate 244 having line 143 as an output. Also, a fault light 178 is illuminated by reject circuit 174 in this preferred embodiment. The unit 44 including the magnet M and Hall Effect switch HE is then removed. Reprocessing may be possible if the shift to the wrong side of position x is at a magnetization amount less than saturation of magnet M.

Since it is acceptable to have the toggle point to the left of desired position x by a small but controlled amount, this small amount or tolerance can be inserted as an adjusted count into a binary count register 190 which is manually adjusted by switch network 192. The register is loaded with a count that indicates the acceptable limit or spacing of the actual measured toggle point to the left of position x. This was explained earlier as successive demagnetizations of magnet M progress the actual measured toggle point from x', to x'', to x. A slight spacing from x to the left is acceptable in practice and provides adjusting tolerances which can be tolerated. This tolerance or limit can be adjusted at any desired manufacturing tolerance acceptable for unit 44 and is generally between 0.005 to 0.020 inches. Again, the count in register 190 is in 1/1000 of an inch to correspond with the relationship of the pulses in line 74. The count difference in comparator 170 is directed by line 174 to register 190 when the measured count of counter 140 exceeds the count of register 160. Of course line 174 is more than one line for providing the difference count in binary fashion. If the count difference is within the adjusted set limit of count register 190, a signal is created in line 194 which indicates that unit 44 is completed, as schematically represented by circuit 200. This allows removal of the combined magnet and switch unit for subsequent use. Counter 140 is cleared through line 202 which controls line 150 and gate 244. As can be seen, if the count difference in comparator 170 indicates that the toggle point is to the right of point x or if it is within a preselected limit with respect to point x as set in register 190, unit 44 is removed and counter 140 is cleared for processing the next combined unit 44 including a magnet M and Hall Effect switch HE.

The count difference in comparator 170 is directed to a standard binary accumulator 210 through line 212 when enabled by line 171. Again more than one line is used to carry the count difference. In practice eight lines 212 are employed. The accumulator is reset by an appropriate line 214. As can be seen, if a unit is rejected or completed, accumulator 210 is reset or cleared at the same time counter 140 is cleared for the next measuring or testing cycle of movable vane 52.

Figure 13:
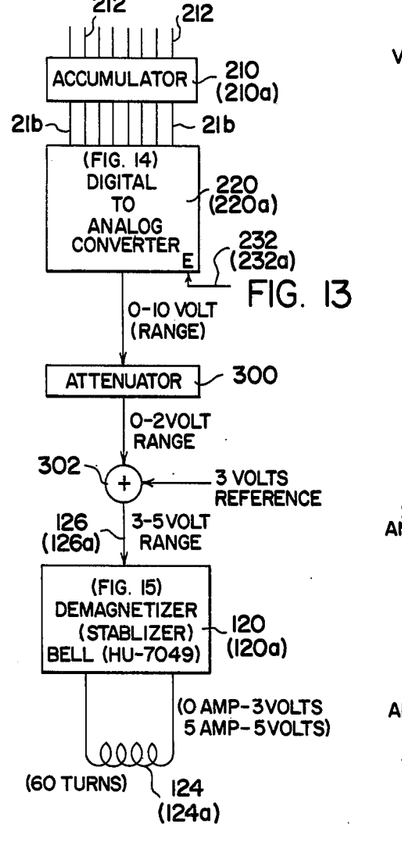
FIG. 13 is a schematic diagram of the system for converting accumulated counts into demagnetizing current as used in both embodiments of the present invention.

Assuming now that the testing or measuring cycle has not rejected unit 44 or indicated that unit 44 is complete, accumulator 210 contains a binary count determined by successive addition of difference counts from comparator 170. During the first measuring cycle for a given unit, accumulator 210 receives only the first difference count, which is a binary count in 1/1000 of an inch. During the next measuring cycle, the first count in accumulator 210 is increased by the next difference count of the next measuring cycle. Consequently, the accumulator count continues to increase until unit 44 is either rejected because of over correction or more normally when unit 44 is completed. The count in the accumulator is directed through line or lines 216 to the input of a digital to analog converter 220 so that the analog signal output directed from converter 220 to line 126 is determined by the magnitude of the added binary counts from the accumulator 210. The magnitude of the analog output signal controls the amount of demagnetization of demagnetizer 120. A variety of demagnetizers which are analog inputs are available on the market. In this instance, a "stabilizer" (HU-7049) sold by F. W. Bell Company and including a SCR control transformer which controls the duty cycle of the magnetizer or stabilizer in accordance with the analog input is used for directing current through coil 124 to demagnetize the magnet M by core 125, as best shown in FIG. 5. Input lines L1, L2 provide the alternating current which is used by demagnetizer 120 for demagnetizing magnet M in accordance with the analog value in line 126 from converter 220 which magnitude is controlled by the value of the count accumulated in accumulator 210. More details of the preferred system for converting accumulated counts into demagnetizing currents is shown in FIG. 13 to be explained later. The demagnetizing operation for magnet M occurs after the measuring cycle has been completed and counter 140 records a measured count indicative of the spacing of the actual toggle point.

In the illustrated embodiment of FIGS. 1-5, when vane 52 on element 50 is retracted to energize the right hand limit switch LS2, line 80 triggers line 171 and a one shot multivibrator 230 through an appropriate time delay 231 to provide a delayed timed pulse at line 232 to an enabling terminal E of converter 220. This pulse determines the amount of time that the analog signal from converter 220 is directed to the demagnetizer 120 which in turn controls the demagnetizing cycle. Of course, other arrangements could be provided for controlling the demagnetizing cycle of demagnetizer 120.

As shown in FIG. 3, line 80 triggers one shot device 230 through an AND gate 246 which is latched to an inoperative condition by inverter 248 if a unit has been rejected or completed and a signal appears in lines 176 or 202 before the delay period of delay 231. These conditions do not require further operation on the unit in the apparatus. If the unit is to be processed, inverter 248 releases gate 246.

In accordance with the illustrated embodiment, the one shot device or multivibrator 230 also actuates a time delay unit 240 after the demagnetizing cycle has been completed to energize a recycle circuit 250 which causes motor control 130 to again reciprocate vane 52 from the right to limit switch LS3 and then back to limit switch LS2. Time delay unit 240 clears counter 140 through a signal in line 242 and OR gate 244 which was previously described. Thus, after the time delay controlled by unit 240 counter 140 is cleared to measure the next spacing between selected position O and the actual toggle position of the Hall Effect switch and magnet unit 44.

Figure 5A:
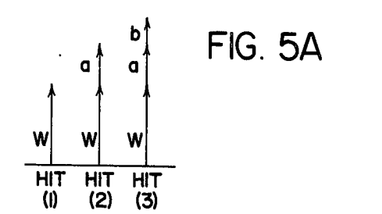
FIG. 5A is a chart showing the flux levels for successive demagnetizations of the magnet in the unit being processed.

In operation of the preferred embodiment of the invention as shown in FIGS. 1-3, motor 72 rotates screw 70 to shift vane 52 to the left until limit switch LS3 is actuated. This switch is beyond normal toggle points for the unit being tested. Thereafter, line 78 causes motor control 130 to reverse motor 72 and retract vane 52 until limit switch LS2 is actuated to produce a B+ signal in control line 80. This stops motor 72 in the retracted position and energizes line 171. Also, limit switch LS2 actuates one shot device 230 in the situation when demagnetization of unit 44 is required. If demagnetization is not required, AND gate 246 is blocked by inverter 248 controlled by the output of either the reject unit 174 or the complete unit 200. Assuming that demagnetization is required, the amount of demagnetization is determined by the circuit as shown in FIG. 3. The accumulated count in counter 140 is representative of the spacing between position O and the actual or measured toggle point. This count is compared with the binary count in set register 160 to provide a binary difference in lines 174 and 212. The operation of comparator 170 when a unit is to be rejected or is completed was previously described. If the count difference exceeds the desired count difference set by network 192, the count in comparator 170 is transferred by line 212 to accumulator 210. This then controls the output line 126 which directs an analog signal to demagnetizer 120 when line 80 actuates one shot device 230. The demagnetizing cycle is the time of the pulse in line 232. Magnet M is then demagnetized in accordance with the count accumulated in accumulator 210. Referring now to FIG. 5A, for illustrative purposes, the amount of demagnetization during the first cycle or hit is represented by the letter W. After the one shot 230 has demagnetized magnet M with a field having a magnitude represented as W and controlled by the count in accumulator 210 and for a time pulse set into the one shot, time delay unit 240 is actuated. Thereafter, line 242 clears the measuring counter 140 through gate 244 and causes recycle unit 250 to recycle motor 72 through motor control unit 130. This again reciprocates vane 52 between limit switches LS2 and LS3. When the vane reaches a reference position O, limit switch LS1 is again actuated. This starts counter 140. When the Hall Effect switch toggles at terminal 32, sensor 106 resets flip-flop 141 to stop measuring counter 140. Counter 140 now contains a new count indicative of the new spacing between the desired toggle point x and the actual or measured toggle point. This new count, which should be less than the prior count, is compared with the set count in register 160 by the binary comparator 170 which gives a new count difference between the new actual toggle point and the desired toggle point x. If the count is negative, there is a rejection of the unit as previously described. If the new count difference is within the set count of register 190, the unit is completed and circuit 200 is actuated. In either instance, counter 140 and accumulator 210 are reset or cleared for processing the next unit.

If the second measurement recorded in counter 140 indicates a spacing from desired position x that is beyond the set count of register 190, the count difference of counter 140 and register 160 as recorded in comparator 170 is added to the previous count in accumulator 210. Thus, the new count in accumulator 210 is the combined prior difference count and the new small difference count. This provides an accumulated digital or binary count which is converted by the digital to analog converter 220 to provide a larger analog output voltage signal. This new voltage is represented by the second hit line in FIG. 5A, wherein the previous demagnetization magnitude of demagnetization W controlled by the first count is added to an increased demagnetization amount a controlled by the next count to produce a larger total analog output in line 126 and a larger demagnetization amount during the second cycle. As limit switch LS2 is operated, one shot 230 is again energized to enable the converter 220 to direct the larger analog signal to demagnetizer 120. This then applies a larger demagnetizing force to the magnet M of the combined magnet and Hall Effect unit. This new demagnetization or second hit is increased by an amount proportional to the new difference between the spacing of the desired toggle point and desired position x. Thus, the demagnetization incrementally changes for each measured cycle by an amount proportional to the new difference between the desired and actual toggle points. After the second demagnetization cycle, time delay device 240 again recycles motor control 130 and clears measuring counter 140 for reciprocating vane 52 back and forth between limit switches LS2 and LS3 for measuring the spacing between the actual point and the desired toggle point. If this new measurement indicates that the unit is still not within the limit of the count in register 190, the next count difference is added to accumulator 210 and the demagnetization controlled by the analog signal from converter 220 is increased proportionally to the amount of the next measured spacing. This next cycle or hit is indicated to the right in FIG. 5A. This process of measuring the toggle point, comparing the measured amount to a reference count and demagnetizing according to the accumulated count continues until the measured toggle point is within the set limit of register 190.

Figure 12:
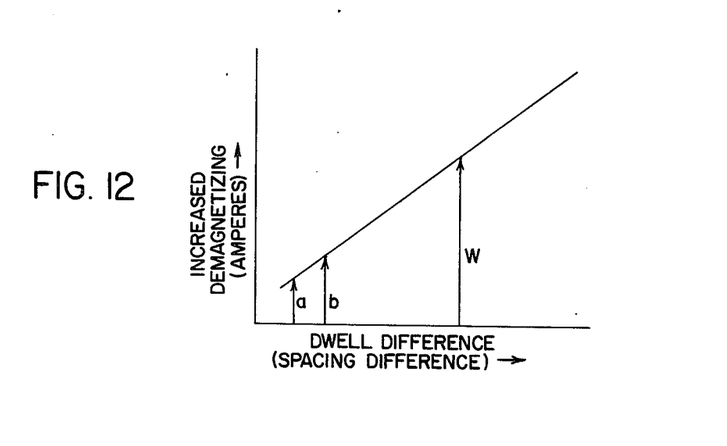
FIG. 12 is a chart used in the embodiments of the present invention.

Since each demagnetization is increased by only the amount determined by the actual measured spacing of a cycle, the demagnetization progresses toward the desired level. FIG. 12 indicates in graphic form that the demagnetizer 120 is controlled to increase demagnetization in accordance with a set relationship between demagnetization current from demagnetizer 120 and subsequent measured differences in measured spacing. The demagnetization increase is progressively smaller as the spacing becomes progressively smaller. The adjustment of the control of the demagnetizer for this purpose is a part of the unit and can be accomplished to bring the magnetization to within close limits to the desired point x.

When a new unit is placed into the apparatus A, pushbutton 260 as shown in FIG. 3 is energized to actuate recycle device 250. Thereafter, the apparatus operates in accordance with the previous description until unit 44 is rejected or completed to within the desired tolerances.

Referring again to FIG. 5A, one aspect of the present invention as previously described is illustrated. In this aspect, each successive cycle of a combined magnet and Hall Effect switch produces an increased demagnetization amount. As shown in FIG. 3, the measured spacing produces the digital difference signal which is added to a previous digital difference signal in accumulator 210 to produce an accumulated digital signal that controls the demagnetizing amount of demagnetizer 120. In this manner, each successive hit on the demagnetizer 120 progresses the tested and measured unit toward the desired toggle point. In FIG. 5A, the first hit is indicated as flux or demagnetizing magnitude W. The second hit is indicated as flux or demagnetizer magnitude W+a. The third hit incorporates an additional demagnetization of amount b. These demagnetizing amounts correspond to the accumulated count of accumulator 210. This concept progressively demagnetizes the magnet until unit 44 has been processed to within desired toggle point limit. Progressively increasing the demagnetization by successive spacing measurements produces a refined arrangement for automatically progressing the toggle point to the desired toggle point or within a selected distance from the desired toggle point. By increasing demagnetization in accordance with the most recent measured difference in toggle spacing, a closely controlled final product is obtainable.

DWELL PREFERRED EMBODIMENT

Many of the combined Hall Effect switches and permanent magnets are used to control the ignition of an internal combustion engine. In that instance, it is desirable to produce a dwell between the release point RP and the operate point OP. The control of one toggle point by changing the magnetization of the magnet automatically controls the other toggle point. Consequently, the previously described embodiment does adjust the dwell of the unit. The prior embodiment of the invention can be modified to specifically obtain a desired adjusted dwell between the operate point and the release point.

Figure 6:
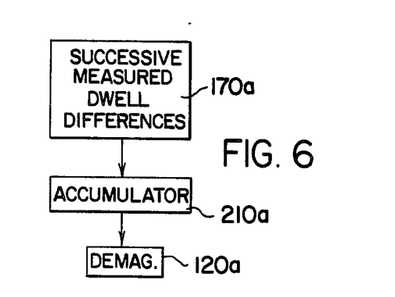
FIG. 6 is a schematic block diagram of certain operating steps which can be used in the one aspect of the present invention.
Figure 7:
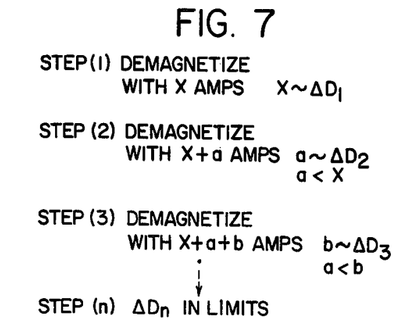
FIG. 7 is a list of steps using the block diagram of FIG. 6.
Figure 8:
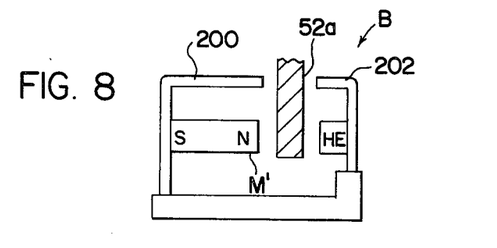
FIG. 8 is a schematic view of a unit including a magnet and a Hall Effect switch used in an ignition system with a movable vane to measure the dwell of the unit for controlling the operation of the invention.
Figure 11:
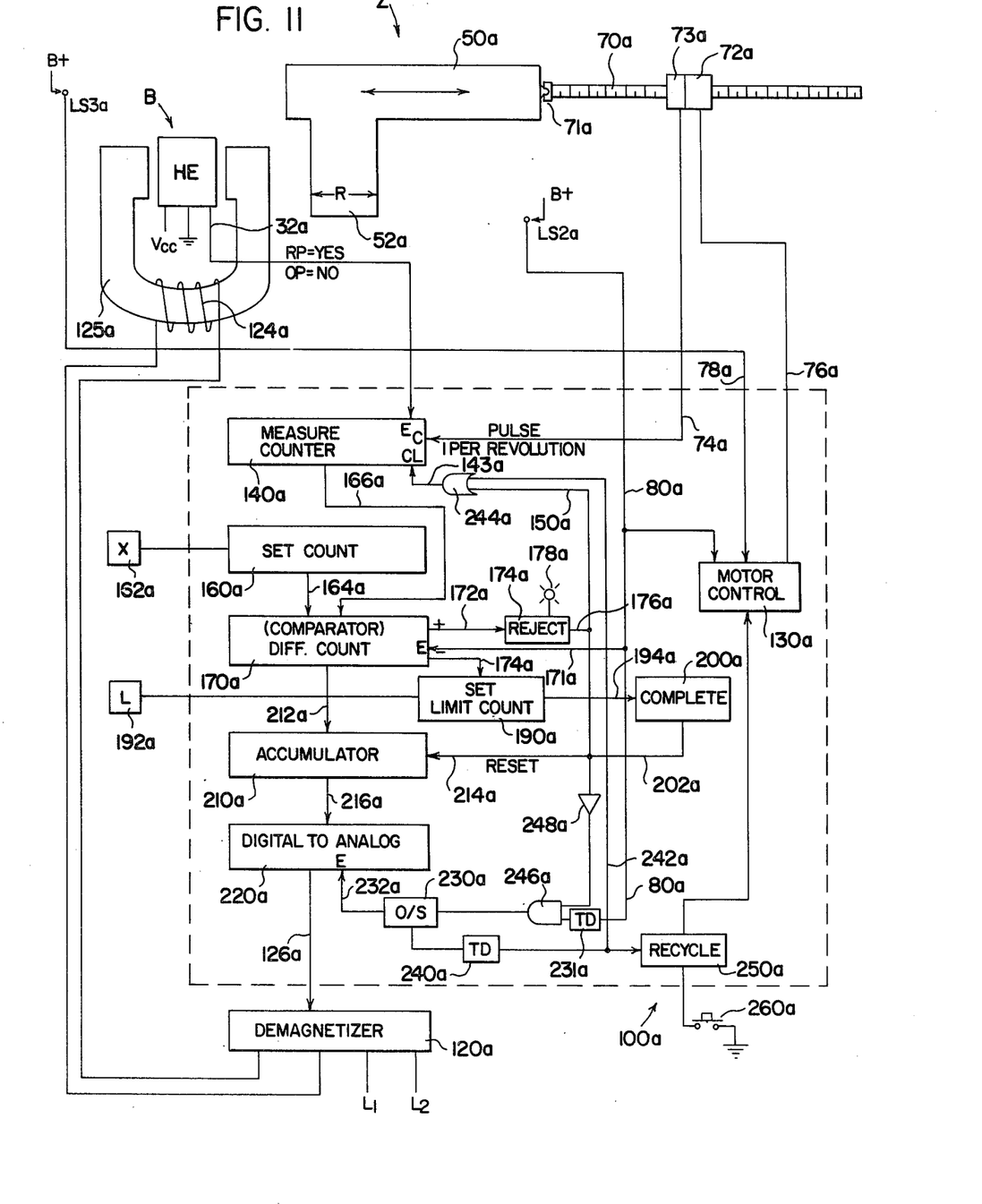
FIG. 11 is a schematic block diagram of a system for adjusting the dwell of a unit.

Referring now to FIG. 8, unit B includes a magnet M' and Hall Effect switch HE held together by an appropriate structure including magnetic returns 200, 202. The vane 52a similar to vane 52 used in the previously described embodiment is reciprocable between the magnet and Hall Effect switch to toggle both the operate point and the release point. The difference in the position of screw 70a between these two operating points is the dwell which is to be adjusted to a preselected value for a unit including a magnet and Hall Effect switch. A general schematic diagram of the modification of the first embodiment of the invention to adjust the dwell of a unit is presented in FIG. 6. The actual dwell is measured and a difference count is recorded for dwell during successive testing cycles by comparator 170a like comparator 170 of the first embodiment. The successive difference counts are accumulated in accumulator 210a, like accumulator 210 of the first embodiment. This controls successive demagnetization of the magnet M' by the demagnetizer 120a. These components are shown in FIG. 11. When the magnet is fully saturated, the dwell is a minimum, as will be explained later. Demagnetization increases the dwell by flattening the magnetization profile exposed to the Hall Effect switch by passing vane 52a adjacent magnet M'. As shown graphically in FIG. 6, the measured difference in spacing between the actual release point RP and operate point OP, i.e. the desired dwell between these two points, produces a different signal which is directed to an accumulator that controls demagnetizing unit 120a. Upon each successive demagnetization, the difference between the two toggle points (i.e. the dwell) is increased since the magnetic flux from the permanent magnet M' is decreased. Thus, each successive demagnetization of the magnet in unit B allows the unit to approach or expand toward a desired dwell. FIG. 7 indicates that each of the successive demagnetization steps is substantially in accordance with the showings in FIG. 5A. Before processing of the unit B, the magnet M' is fully saturated so that it has the smallest possible dwell between the release point and the operate point. Subsequent demagnetization will cause the dwell to increase toward the desired or selected level. Each successive demagnetization cycle is proportionately larger according to the individual measured spacing between the desired dwell and the actual measured dwell.

Figure 9:
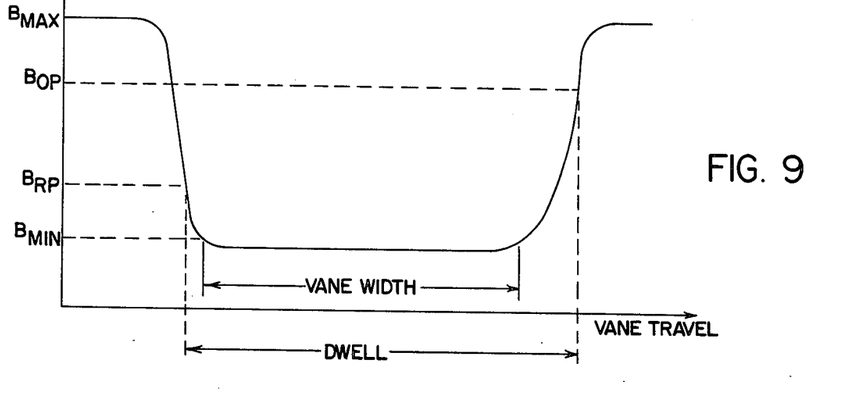
FIG. 9 is a graph showing the flux density at the Hall Effect switch as the vane of FIG. 8 is moved thereby to determine dwell.
Figure 10:
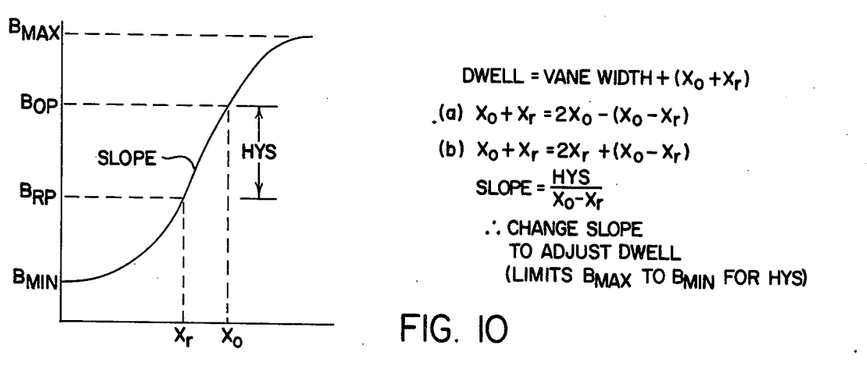
FIG. 10 is the graph of FIG. 9 with the ends superimposed on one curve to show the relationship between the operate point and release point and also certain appropriate mathematical relationships.

Certain characteristics of the unit B are shown in FIGS. 9 and 10. FIG. 9 illustrates the periodic fluctuation in the flux density at the Hall Effect switch as the vane 52a passes by magnet M'. The difference between the release point $B_{RP}$ and the operate point $B_{OP}$ is the dwell which, when the magnet is fully magnetized has the lowest value. By demagnetizing permanent magnet M', the graph of FIG. 9 flattens out to increase spacing between the operate point and release point, and thus the dwell. As vane 52a travels in the direction indicated in FIG. 9 which is opposite to the direction shown in FIG. 11, the Hall Effect switch HE is first released and then operated. These two points are measured to determine the dwell as a function distance of vane travel and screw 70a. This measured dwell also includes the width of vane 52a which is a constant that is not changed by demagnetizing magnet M'.

Referring now to FIG. 1, the release point and operate point can be superimposed upon a single portion of a flux density curve as illustrated in FIG. 9. From this curve, together with the curve of FIG. 9, it is clear that the dwell of magnet M' as vane 52a passes the magnet equals the vane width plus Xo and Xr. The hysteresis HYS is the difference between the flux density at the release point and the operate point. These two flux density values are selected so that they do not exceed the maximum or minimum values of the magnetization curve. It is noted that the variable factor in dwell is the summation of Xo and Xr. This summation can be written in two separate formulae (a) and (b) as shown in FIG. 10. In addition, the slope of the magnetization curve between the operate point and the release point is the hysteresis (HYS) divided by the positive difference between Xo and Xr. This formula for the slope is indicated also in FIG. 10. By incorporating this mathematical relationship into either formula (a) or formula (b) it is seen that the dwell as a known vane 52a passes the magnet, can be controlled by the slope of the magnetization flux pattern as shown in FIGS. 9 and 10. Thus, as long as the upper and lower values of the hysteresis (HYS) value is between the maximum and minimum magnetization values, the slope of the exposed flux field may be varied to change the dwell of unit B. The present invention relates to the concept of changing the slope by demagnetizing a magnet combined with a companion Hall Effect switch. By starting with a saturated magnet, the summation of Xo and Xr for a given Hall Effect switch is at a minimum. The magnet may then be demagnetized repeatedly as previously described until the desired summation of Xo and Xr is achieved. This can be done with respect to relatively wide ranges of operate point and release point. Thus, the calculations shown in FIG. 10 verify the fact that the dwell of unit B can be adjusted by changing the magnetization curve successively until the desired dwell is obtained.

The basic system used in the first embodiment of the invention and best shown in FIGS. 1 and 3, can be employed for adjusting the dwell between two toggle points of the unit B including magnet M' and Hall Effect switch HE as schematically illustrated in FIG. 8. Such a modification of the first preferred embodiment is system Z shown schematically in FIG. 11 wherein like components of system A of FIGS. 1–5A have like numbers with the subscripts a and having the same purpose and function unless stated otherwise. Consequently, the description of these components in FIGS. 1–5A apply equally to the corresponding elements in FIG. 11. In the embodiment of the invention for adjusting the measured dwell shown in FIG. 11, motor 72a reciprocates element 50a through unit B and between limit switches LS3a and LS2a. This reciprocation can be accomplished as described in connection with FIG. 3. An axially fixed screw coupled to element 50a by a receiving nut could be used. For simplicity, element 50a is shown to be reciprocated by screw 70a through unit B between the magnet and Hall Effect switches as shown in FIG. 3. When the element 50a or vane 52a reaches limit switch LS3a, motor 72a, is reversed and screw 70a retracts elements 50a to the right from between the magnet and Hall Effect switch. The action of Hall Effect switching terminal 32a replaces sensor 106 and flip-flop 141 of the previously described embodiment of the invention. When the release point is reached as vane 52a approaches the magnet of unit B, a high logic at terminal 32a enables counter 140a. As vane 52a progresses to the end of the dwell (which is controlled by width R of vane 52a and the two toggle points), the operate point is reached as shown graphically in FIG. 9. This causes a low logic to appear in switch terminal 32a to disable counter 140a. Thus, binary counter 140a counts, in distance increments, the actual dwell between the toggle points of unit B. Pulses from line 74a, which in the preferred embodiment produce a pulse upon each 1/100 rotation of screw 70a, produces a pulse for each 1/1000 of an inch. Each revolution of screw 70a by motor 72a moves the screw 1/10 of an inch and provides 100 pulses by encoder 73a in line 74a. If an axially fixed screw drive is used, each rotation of the screw moves element 50a 1/10 of an inch to give the same effect. Set count register 160a is adjusted by switch network 162a to register the desired dwell in this register. This desired dwell in counts in register 160a is compared with the measured dwell in counts accumulated by counter 140a by comparator 170a when enabled by line 171a to provide a binary count difference which reads in thousandths of an inch between the desired dwell and the actual dwell. The compared counts are directed to comparator 170a by lines 164a, 166a. If the measured dwell is too large in this particular embodiment, a signal in line 172a is created by an excess of counts from counter 140a over the counts in register 190a. This rejects unit B by circuit 174a. This situation can be caused by demagnetization of magnet M' beyond that which is necessary to produce the desired dwell, among other fault situations. If the difference count by comparator 170a is within a set limit loaded into register 190a by adjustable switch network 192a and read by the count difference in line 174a, unit B is properly adjusted and completed as indicated by a signal line 194a. If neither of these conditions exist, the difference count from comparator 170a is transferred to accumulator 210a by lines 212a. The accumulator controls the digital to analog converter 220a by a binary count in lines 216a. As in the first embodiment of the invention, this concept determines the amount of demagnetization of coil 124a which is associated with the demagnetizing unit having a core 125a and constructed in accordance with the illustrated structure of FIG. 5 and schematically illustrated adjacent the unit B in FIG. 11. Of course, this illustration of the core 125a is schematic and there is no interference between the demagnetizing mechanism and movement of element 50a or vane 52a during each successive reciprocated measuring cycle. As in the first embodiment of the invention, when element 50a reciprocates back to limit switch LS2a, the one shot 230a is actuated by line 80a and gate 246a to energize the digital to analog converter 220a for a selected time set by the one shot device 230a. Thereafter, the time delay device 240a resets counter 140a by line 242a and gate 244a and starts the next cycle of vane 52a through recycle circuit 250a and motor control 130a. During each successive cycle until register 190a indicates proper adjustment, accumulator 210a continues to increase its digital binary count for increasing the amount of demagnetization by demagnetizer 120a. If this demagnetization causes the dwell to expand beyond the set dwell count in register 160a, the unit is rejected by a signal in line 172a that actuates reject circuit 174a and fault light 178a. Basically, the circuit shown in FIG. 11 operates in accordance with the circuit shown in FIG. 3, except it measures the distance between the toggle points as vane 52 passes magnet M from right to left, which is the measured or actual adjusted dwell. System Z continues to demagnetize magnet M' until the measured or actual dwell is within a set limit of the desired dwell as set into register 190a. Other circuits could be used for this purpose; however, the basic system as illustrated in FIG. 11 and explained herein has proven satisfactory in operation to adjust the dwell of unit B.

Referring now to FIG. 12, as previously mentioned the digital amount from converter 220a (or converter 220) determines the amount of demagnetization by demagnetizer 120a (or demagnetizer 120) in accordance with the straight line function built into the demagnetizer. Each of the separate increased digital counts causes a corresponding increase in the amount of demagnetization of the magnet M or magnet M' to approach the desired dwell in the second embodiment shown in FIG. 11 or the toggle point in the first embodiment.

Other systems could be used to modify the slope of the magnetization profile created by the Hall Effect switch by changing the magnetization state of the magnet. The changes in slope to modify the dwell, as explained in the second embodiment of the invention, or to change a specific toggle point, as explained in the first embodiment, may be accomplished by a variety of systems for changing the magnetization curve of the controlling magnet successively after measuring the difference between the actual and desired toggle point or dwell. As indicated in FIG. 12, each measured difference in spacing or difference in dwell requires a further increase in the amount of demagnetization. This concept is also schematically illustrated in FIG. 5A.

Figure 14:
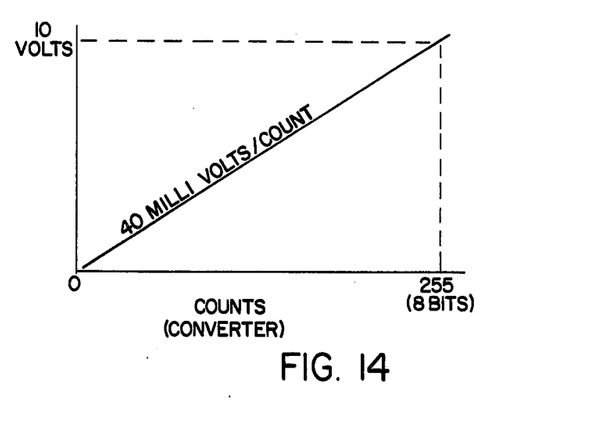
FIG. 14 is a graph showing the relationship between the accumulated counts and the analog voltage used in the system shown in FIG. 13.
Figure 15:
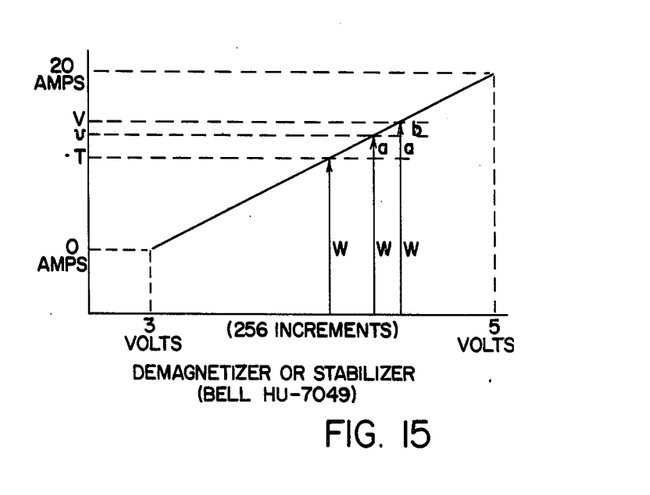
FIG. 15 is a graph showing the relationship between the biased analog voltage and the demagnetizing current used in the system shown in FIG. 13; and, FIG. 16 is a second quadrant demagnetizing curve of magnets M and M' which are demagnetized to adjust the toggle point or dwell in the two illustrated embodiments of the present invention.
Figure 16:
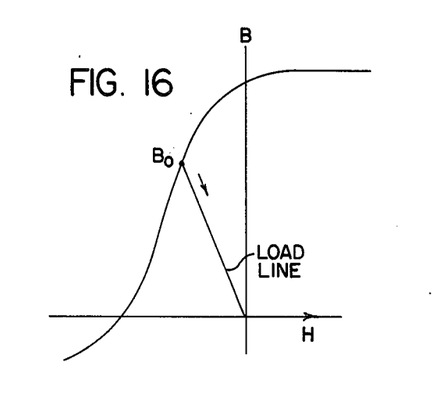

In the two embodiments of the present invention, the amount of demagnetization is controlled by the accumulated count in accumulator 210 or 210a. Although this can be done in a variety of arrangements, the details of the preferred arrangement for accomplishing this function are schematically illustrated in FIG. 13 which is taken together with the graphs shown in FIGS. 14 and 15. As digital counts are added to accumulator 210 or 210a, as shown in FIG. 13, they control the digital input to the converter 220 or 220a. These converters operate in accordance with the graph shown in FIG. 14 wherein the level of the count from the accumulators determines the voltage between two voltages indicated as 0 and 10 volts. In the illustrated systems A and Z, the digits of the digital registers and counters are eight bits; therefore, the accumulators can direct increasing digital numbers between 0 and 255 to the input of the digital to analog converter 220 or 220a. In accordance with the graph of FIG. 14, each count from the accumulator increments the output voltage of the converter in the range of 0–10 volts by approximately 40 millivolts per count. Thus, the output of the digital converter 220 or 220a is in the range of 0–10 volts according to the accumulated count in accumulator 210 or 210a. In the preferred embodiment, the voltage from the converter is attenuated by an attenuator 300 which modifies the range of voltage from 0–10 volts to proportionately 0–2 volts. This attenuated voltage is still proportional to the accumulated counts in accumulator 210 or 210a as determined by the graphic characteristics of FIG. 14. To the attenutated proportionate voltage there is added, by a voltage adding device 302, a 3 volt bias or reference voltage so that the output of the voltage adding device 302 is in the range of 3–5 volts according to the accumulated count. This voltage is directed to the demagnetizer 120 or 120a which operates in accordance with the graph shown in FIG. 15. Various demagnetizers or magnet stabilizers could be used. In practice the demagnetizer or magnet stabilizer is produced by the F. W. Bell Company of Columbus, Ohio and sold under the number HU-7049. This unit operates with the graphic characteristics illustrated in FIG. 15, wherein ampere output varies generally linearly between 0 and 20 amperes with inputs between 3 and 5 volts. Thus, the amount of amperes directed from the demagnetizer or stabilizer 120 or 120a is between 0 and 20 amps determined by the voltage from the voltage adding device 302. As accumulator 210 or 210a increases during successive measuring of the spacing or dwell, the voltage directed to stabilizer 120 or 120a is incremented according to the counts of the accumulator. As each successive measuring cycle increases the accumulator count, the amperes directed from the demagnetizer or stabilizer increases as previously indicated. This increase is represented by the values shown in the lines of graph in FIG. 15 and represented by the letters T, U and V on the ampere ordinate of the graph. Thus, successive increases in the count of accumulator 210 or 210a causes successively increasing amperes to be directed from the demagnetizer or stabilizer 120 or 120a to progressively decrease the demagnetization of either magnet M in the first embodiment or magnet M' in the second embodiment. This forces the magnetic flux curve to flatten and cause the toggle point or dwell to progress toward the desired values. In practice, the permanent magnets M and M' are formed from Alnico VIII, which has a representative second quadrant demagnetization curve as shown in FIG. 16. An operating point $B_O$ defines the load line after the magnet is saturated and ready for processing by system A or Z. Successive demagnetization of the magnets forces the operating point of the magnets down the load line toward the desired operating point for the magnet to produce the desired toggle point and/or dwell. As can be seen in FIG. 15, as the toggle point or dwell progresses toward the desired value, incrementally smaller but additional demagnetization fields are directed to the magnets to progressively shift the demagnetization of magnet M or magnet M' toward the desired value. Other similar arrangements could be used for progressing the demagnetization or stabilization of the magnets toward the desired operating point or dwell being measured by the system A and Z. Also, more than eight lines could be used to obtain more than 256 increments although this is sufficient in practice, since the adjustment is less than about 0.100 inches.

Having thus defined the invention, it is claimed:

1. A method of setting the dwell to a desired dwell between the operate point and release point of a Hall Effect switch mounted with an operating permanent magnet essentially saturated to produce a lower dwell than desired, said method comprises the steps of:
    (a) measuring the dwell between said points;
    (b) determining the difference between the measured dwell and desired dwell; and,
    (c) demagnetizing said magnet with a demagnetizing field controlled by said difference to increase said dwell toward said desired dwell.

2. A method of setting a measured actual switching characteristic to at least within a given amount of a desired switching characteristic in a unit including a Hall Effect switch and a magnet mounted with said switch to operate the Hall Effect switch, said method comprising the steps of:
    (a) moving a magnetic flux affecting member past said magnet to sense the measured actual switching characteristic;
    (b) comparing said measured actual switching characteristic with said desired switching characteristic;
    (c) creating a difference signal proportional to the difference between said measured switching characteristic and said actual switching characteristic; and,
    (d) if said difference signal exceeds said given amount, demagnetizing said magnet an amount controlled by said difference signal.

3. A method as defined in claim 2 including the additional steps of:
    (e) again moving said magnet member past said magnet to sense a new measured actual switching characteristic;
    (f) comparing said new measured actual switching characteristic with said desired switching characteristic;
    (g) creating a new difference signal proportional to the difference between said new measured switching characteristic and said actual switching characteristic;
    (h) if said new difference signal exceeds said given amount, demagnetizing said magnet an amount controlled by the sum of said first mentioned difference signal and said new difference signal, and,
    (i) repeating steps (f), (g) and (h) with increasing demagnetization proportional to each new difference signal until a new difference signal is within said given amount.

4. An apparatus for setting a measured switching characteristic to a desired switching characteristic of a unit including a Hall Effect switch and a permanent magnet for operating said switch, said apparatus comprising means for moving a magnetic flux affecting element repeatedly past said magnet to cause said switch to operate in successive cycles of said element being moved past said magnet; means for sensing the switching characteristic of said Hall Effect switch during each of said cycles of said element; a digital counter means for creating a measured digital count for each of said cycles, said measured digital count being controlled by said movement of said element and by said sensed switching characteristic and indicative of said switching characteristic for each of said cycles, said counter means having means for starting, means for stopping and means for receiving a count impulse, said starting and stopping means being responsive to the position of said element and said counting means being controlled by the position of said element during said movement; means for storing a fixed digital count indicative of said desired characteristic; means for creating a difference digital count between said measured digital count and said fixed count for each of said cycles; a count accumulator means for accumulating said difference count for each of said cycles; demagnetizing means for demagnetizing said magnet by a magnitude in accordance with the accumulated difference count; and, means for stopping said element when a difference count in a cycle is within a selected value.

5. An apparatus as defined in claim 4 wherein said switching characteristic is the dwell between the operate point and release point of said Hall Effect switch as said element passes said magnet, and said sensing means includes means for actuating said starting means at one of said points in one of said cycles and means for actuating said stopping means at the other of said points in said one of said cycles; and wherein said fixed digital count is representative of a desired dwell.

6. A method of setting the relative magnetic relationship between a Hall Effect digitial switch having a magnetic field responsive portion, which portion will cause said switch to be actuated when a magnetic field of changing magnitude reaches a selected field strength at said field responsive portion, and a permanent magnet having an outwardly extending magnetic field adjustable by changing magnetization of said magnet between an upper field strength and a lower field strength at a selected distance from said magnet, said selected field being between said upper and lower field strengths, said method comprising the steps of:
    (a) mounting said switch and magnet with said adjustable magnetic field exposed to said magnetic field responsive portion and said field responsive portion spaced from said magnet a distance generally equal to said selected distance;
    (b) moving a magnetic shield element between said magnet and switch from a known position where said switch is not actuated to an actual position where said switch is actuated;
    (c) determining the spacing between said actual position and a preselected reference position; and,
    (d) if said spacing exceeds a given amount, modifying the magnetization of said permanent magnet to shift said actual position toward said reference position.

7. A method as defined in claim 6 wherein said moving step includes moving said shield element from a known position remote to said magnet and switch to said actual position generally between said magnet and switch.

8. A method of setting a given dwell within a selected dwell range between the operate point and release point of a Hall Effect switch mounted adjacent to a permanent magnet as a unit and exposed to the field of said magnet as a vane passes the switch in a given path, said method comprising:

(a) providing said magnet with a magnetic field;
(b) passing said vane along said path and measuring the dwell of said switch between the operate point and release point as the distance said vane travels between said points;
(c) determining the difference between said measured dwell and said given dwell;
(d) if said measured dwell is less than said given dwell and outside said selected dwell range, demagnetizing said magnet with a first flux field;
(e) again passing said vane along said path and measuring the dwell of said switch between said points as the distance said vane travels between said points;
(f) determining the difference between said second measured dwell and said given dwell;
(g) if said second measured dwell is less than said given dwell and outside said selected dwell range, demagnetizing said magnet with a second flux field greater than said first flux field; and,
(h) repeating steps (e), (f) and (g) with successively increasing demagnetizing flux fields until said measured dwell is within said selected range of dwells.

9. A method as defined in claim 8 wherein said dwell range is from a selected dwell up to said given dwell.

10. A method as defined in claim 9 including the further step of rejecting said unit if a measured dwell exceeds said given dwell.

11. A method as defined in claim 8 including the further step of rejecting said unit if a measured dwell exceeds said given dwell.

12. A device for setting the relative magnetic relationship between a Hall Effect switch with an unknown operating field strength and a permanent magnet spaced by an air gap from said switch and having a magnetic field with a field strength greater than said operating field strength exposed to said switch, said device comprising: a moving means for progressively decreasing the strength of said magnetic field exposed to said switch as a member moves along a path; means for detecting the position of said member when said progressively decreasing field equals said operating field; means for storing said position as a position digital signal; means for storing a reference digital signal; means for creating a difference signal indicative of the difference between said position digital signal and said reference digital signal; and means for demagnetizing said magnet to reduce said magnetic field when said difference signal exceeds a given amount.

13. A device as defined in claim 12 wherein said demagnetizing means includes means for demagnetizing said magnet by a demagnetizing flux field having a strength determined by the magnitude of said difference signal.

14. A device for setting the dwell between the operate point and release point of a Hall Effect digital switch biased by a permanent magnet having a magnetic field exceeding the field strength corresponding to said operate point of said Hall Effect switch, said device comprising: means for moving a flux shielding member progressively between said magnet and said switch; first means for sensing said operate point as said member is moved; means responsive to said first sensing means for creating a binary operate signal when said operate point is sensed; second means for sensing said release point as said member is moved; means responsive to said second sensing means for creating a binary release signal when said release point is sensed; means responsive to the binary operate and release signals for creating a digital signal representative of the distance said member moves between creation of said operate and release points; means for storing a digital reference signal; means for creating a control signal having a signal magnitude controlled by the difference between said representative signal and said reference signal; and, means for demagnetizing said magnet in accordance with the magnitude of said control signal.

* * * * *